United States Patent [19]

Madsen

[11] Patent Number: 5,453,714

[45] Date of Patent: Sep. 26, 1995

[54] BINARY FM DEMODULATOR WITH SELF-ADJUSTING RESONANT OPERATING FREQUENCY ACCORDING TO DEMODULATED BINARY OUTPUT SIGNAL DUTY CYCLE

[75] Inventor: Benny Madsen, Sunnyvale, Calif.

[73] Assignee: National Semiconductor Corporation, Santa Clara, Calif.

[21] Appl. No.: 396,441

[22] Filed: Feb. 28, 1995

Related U.S. Application Data

[63] Continuation of Ser. No. 302,272, Sep. 8, 1994, abandoned, which is a continuation of Ser. No. 89,018, Jul. 9, 1993, abandoned, which is a continuation-in-part of Ser. No. 29,134, Mar. 10, 1993.

[51] Int. Cl.$^6$ .............................. H03D 3/02; H04L 27/148
[52] U.S. Cl. ........................ 329/301; 329/302; 329/303; 329/337; 375/328; 375/334
[58] Field of Search .................................. 329/300, 301, 329/302, 303, 337, 319, 325, 334, 336, 338, 339, 323; 375/80, 81, 82, 88, 89, 90, 91, 51, 99, 45, 60, 62

[56] References Cited

U.S. PATENT DOCUMENTS

| 4,198,609 | 4/1980 | Ishigaki et al. ............... 329/337 X |
| 4,239,992 | 12/1980 | Perkins ............................ 307/265 |
| 4,449,102 | 5/1984 | Frazer et al. . |
| 4,469,082 | 9/1984 | Nishitoba et al. .................. 123/609 |
| 4,516,083 | 5/1985 | Turney ............................. 331/1 A |
| 4,542,531 | 9/1985 | Fukumura ........................... 455/76 |
| 4,703,520 | 10/1987 | Rozanski et al. .................... 455/75 |
| 4,761,821 | 8/1988 | Mawhinney et al. ................. 455/73 |
| 4,873,702 | 10/1989 | Chiu ................................. 375/76 |
| 4,903,257 | 2/1990 | Takeda et al. ...................... 370/29 |
| 5,077,538 | 12/1991 | Gehrt et al. .................... 329/336 X |
| 5,230,088 | 7/1993 | Kramer, Jr. et al. ................. 455/76 |
| 5,272,657 | 12/1993 | Basehore et al. ................. 364/728.03 |
| 5,276,913 | 1/1994 | Lee et al. .......................... 455/76 |
| 5,302,910 | 4/1994 | Konda et al. ...................... 329/336 |
| 5,315,262 | 5/1994 | Schulz ............................ 329/302 |
| 5,315,284 | 5/1994 | Bentley et al. .................. 340/146.2 |
| 5,319,799 | 6/1994 | Morita .............................. 455/78 |
| 5,327,582 | 7/1994 | Wong .............................. 455/76 |
| 5,341,120 | 8/1994 | Nakajima ....................... 340/146.2 |

(List continued on next page.)

FOREIGN PATENT DOCUMENTS

| 0333419A2 | 9/1989 | European Pat. Off. .......... H04B/1/56 |
| 2523388 | 9/1983 | France . |
| 2535545 | 5/1984 | France . |
| 0034747 | 3/1979 | Japan ............................. 329/337 |
| 0165005 | 12/1980 | Japan ............................. 329/337 |
| 0031208 | 3/1981 | Japan ............................. 329/337 |
| 2188212 | 9/1987 | United Kingdom .............. H04B/1/56 |
| WO81/02653 | 9/1981 | WIPO . |
| WO92/22147 | 12/1992 | WIPO ............................. H04B/1/40 |

OTHER PUBLICATIONS

Shigeki Saito et al., "State-Preserving Intermittently Locked Loop (SPILL) Frequency Synthesiser for Portable Radio,"

(List continued on next page.)

Primary Examiner—David Mis
Attorney, Agent, or Firm—Limbach & Limbach

[57] ABSTRACT

A demodulator for demodulating a binary frequency-modulated signal includes a demodulator with a quadrature tank circuit and a duty cycle monitor circuit. The quadrature tank circuit has a voltage-controllable resonant frequency for compensating for shifts in the carrier frequency of the incoming signal and shifts in the tank circuit component values so as to allow the use of a high-Q tank circuit and thereby maximize use of the incoming signal energy. The quadrature tank circuit is a reactive circuit (with both inductive and capacitive elements) which includes a varactor diode having a voltage-controllable capacitance. The duty cycle monitor circuit measures the duty cycle of the demodulated binary output from the demodulator, and provides a control voltage to the quadrature tank circuit for adjusting its center frequency of operation.

33 Claims, 9 Drawing Sheets

U.S. PATENT DOCUMENTS 5,351,031  9/1994  Henderson .......................... 340/146.2
5,363,402  11/1994  Harmon ...................................... 375/1

OTHER PUBLICATIONS

*IEEE Transactions on Microwave Theory and Techniques,* vol. 37, No. 12 (Dec. 1989), pp. 1898–1903.

Supplemental Information Disclosure Statement including four declarations and exhibits A–D which were previously filed on Sep. 19, 1994, in U.S. patent application Ser. No. 08/029,134.

BINARY FM DEMODULATOR WITH SELF-ADJUSTING RESONANT OPERATING FREQUENCY ACCORDING TO DEMODULATED BINARY OUTPUT SIGNAL DUTY CYCLE

This is a continuation of a prior application Ser. No. 08/302,272, filed on Sep. 8, 1994, of BENNY MADSEN for BINARY FM DEMODULATOR WITH SELF-ADJUSTING RESONANT OPERATING FREQUENCY ACCORDING TO DEMODULATED BINARY OUTPUT SIGNAL DUTY CYCLE, (now abandoned), which was a file wrapper continuation of application Ser. No. 08/089,018, filed on Jul. 9, 1993 (now abandoned), which was a continuation-in-part of Ser. No. 08/029,134, filed on Mar. 10, 1993 (now pending).

BACKGROUND OF THE INVENTION

1. Field of the Invention

The present invention relates to frequency modulation ("FM") demodulators, and in particular, FM demodulators with adjustable resonant frequencies of operation.

2. Description of the Related Art

Various forms of frequency demodulators, or discriminators, for demodulating FM signals are well known in the art. A common type of frequency demodulator which is used in the demodulation of a digitally modulated FM signal includes a mixer interconnected with a phase shifter. The phase shifter and one input of the mixer both receive the modulated signal. The output of the phase shifter, which is a phase-shifted replica of the inputted modulated signal, is received by the other input of the mixer. These two signals are mixed within the mixer and thereby produce a low frequency output signal which corresponds to the instantaneous frequency deviation of the inputted modulated signal.

The phase shifter is typically some form of a resonant element or structure, such as a series or parallel resonant circuit made up of inductors and capacitors (e.g. a quadrature tank circuit). Such reactive components will have values which are dependent upon temperature. This results in the resonant frequency of the circuit being temperature-dependent, which in turn causes the resulting phase shift to also be temperature-dependent.

When using this type of demodulator circuit for receiving digitally modulated FM signals, it is important that the voltage swing of the mixer output signal be maximized. This can be achieved by using a phase shifter with a high circuit Q value, provided that the resonant frequency of the phase shifter is correct. If the resonant frequency shifts with temperature, or if the center, or carrier, frequency of the incoming FM signal shifts, the output voltage swing can rapidly decrease because of the narrowness of the bandwidth of the phase shifter due to its high circuit Q value.

Accordingly, it would be desireable to have a frequency demodulator which has an adjustable resonant frequency to allow for compensation of phase shifts caused by temperature variations or shifts in the carrier frequency of the incoming FM signal.

SUMMARY OF THE INVENTION

A demodulator in accordance with the present invention includes a frequency discriminator and a controller therefor. The frequency discriminator, with a resonant frequency of operation which is adjustable in accordance with a frequency control signal from the controller, demodulates a frequency-modulated signal having an associated carrier frequency to produce a demodulated signal. The controller receives and analyzes the demodulated signal and in accordance therewith provides the frequency control signal to the frequency discriminator.

These and other features and advantages of the present invention will be understood upon consideration of the following detailed description of the invention and the accompanying drawings.

DETAILED DESCRIPTION OF THE INVENTION

Figure 1:
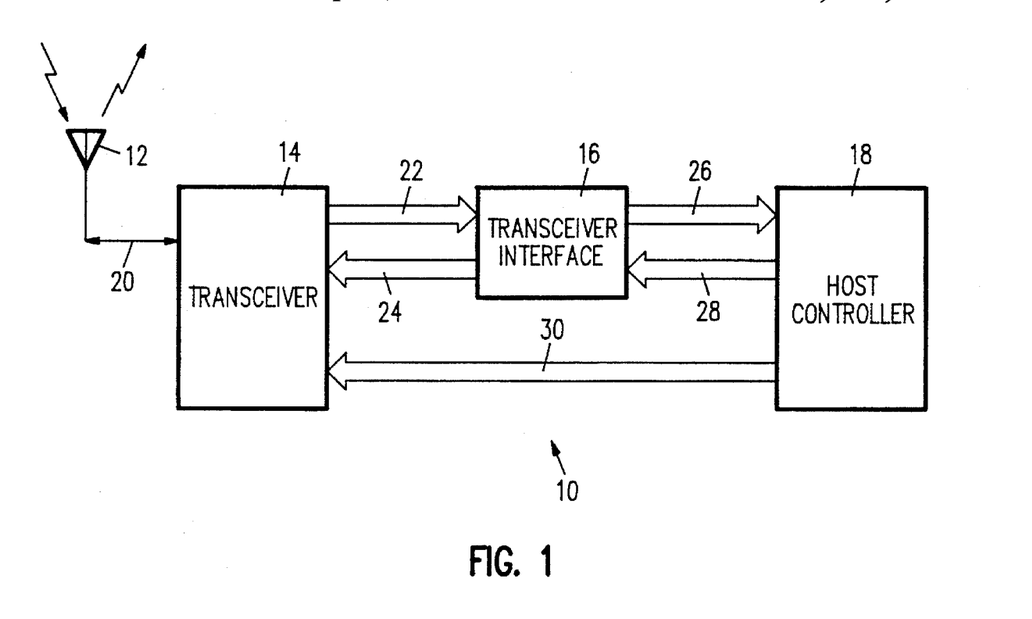
FIG. 1 is a functional block diagram of an RF transceiver using a demodulator in accordance with the present invention.

Referring to FIG. 1, an RF transceiver 10 using a demodulator in accordance with the present invention includes an antenna 12, transceiver 14, transceiver interface 16 and host controller 18, as shown. Between the antenna 12 and transceiver 14 is an RF signal path 20 which carries, according to a TDD format, the modulated transmit signal from the transceiver 14 to the antenna 12 and the modulated receive signal from the antenna 12 to the transceiver 14. As discussed further below, a number of signals 22, 24 pass between the transceiver 14 and transceiver interface 16 as do a number of signals 26, 28 between the transceiver 16 and host controller 18. Additional signals 30 pass from the host controller 18 to the transceiver 14.

Figure 2:
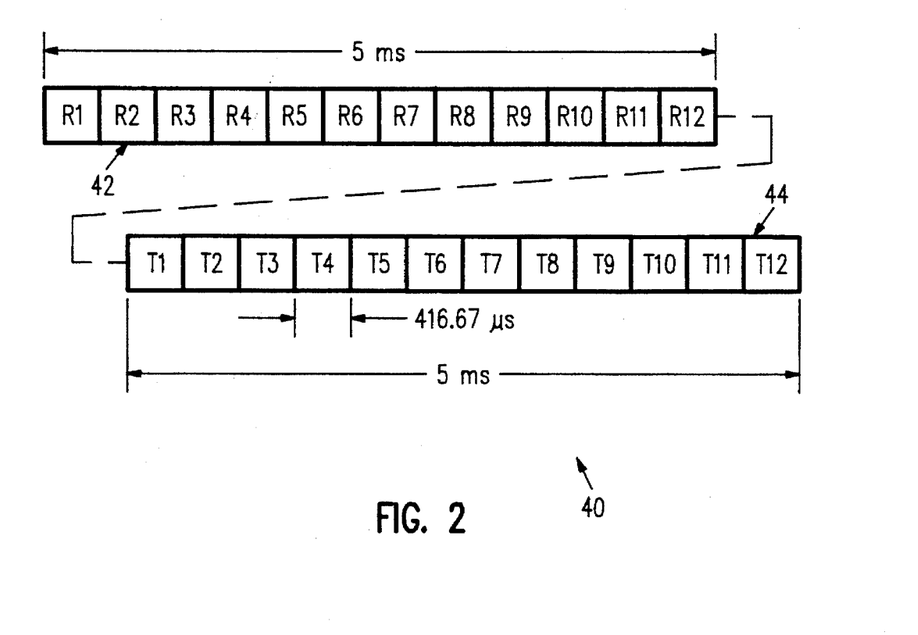
FIG. 2 illustrates an exemplary TDD transmit/receive telecommunications data frame structure for an RF transceiver using a demodulator in accordance with the present invention.

Referring to FIG. 2, an RF transceiver 10 using a demodulator in accordance with the present invention operates in a TDD format, thereby allowing a full duplex communication channel to be established. This duplexing technique uses separate time slots on a single carrier signal for transmitting and receiving data signals. The structure of the data frame is as shown. (The particular data frame format shown is the standard for the Digital European Cordless Telecommunications ["DECT"] system.)

As shown, the complete data frame 40 is ten milliseconds (10 msec) in duration, with a five millisecond (5 msec) receive subframe 42 and five millisecond (5 msec) transmit subframe 44. Each subframe 42, 44 is divided into 12 time slots of 480 bit times in duration, i.e. 416.67 microseconds (μsec) each. When a communication link is made, a receive and transmit time slot are assigned to the users (normally with the same time slot number [e.g. R3 and T3] used for both receive and transmit). Multiple users are thereby accommodated by assigning different time slots to the different users.

Figure 3:
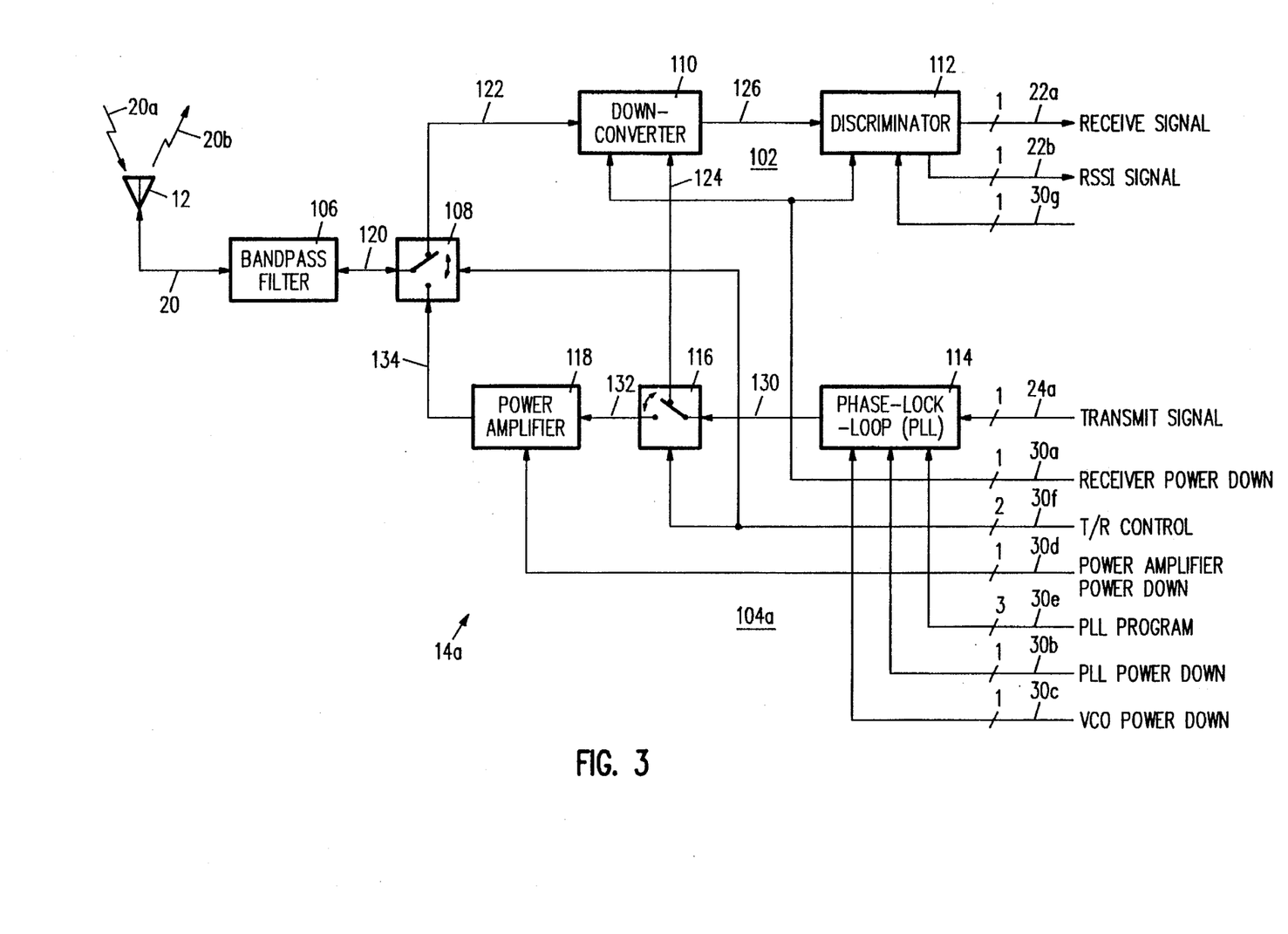
FIG. 3 is a block diagram of an RF transceiver using a demodulator in accordance with the present invention.

Referring to FIG. 3, a preferred embodiment of a transceiver 14a using a demodulator in accordance with the present invention includes a receiver 102, transmitter 104a, a bandpass filter 106 and antenna signal switch 108, as shown. The receiver 102 includes a down-converter 110 and discriminator 112. The transmitter 104a includes a phase-lock-loop ("PLL") 114, transmit signal switch 116 and power amplifier 118.

During signal reception, a modulated receive signal 20a is received via the antenna 12, filtered by the bandpass filter 106 and conveyed to the antenna signal switch 108 (e.g. a PIN diode switch). In accordance with a switch control signal 30f, the antenna signal switch 108 passes the filtered, modulated receive signal 122 to the down-converter 110. The down-converter 110, in accordance with an enablement signal 30a, uses a local oscillator ("LO") signal 124 to perform a single down-conversion of this receive signal 122. The down-converted signal 126 is passed to the discriminator 112, where it is discriminated, or frequency-demodulated, in accordance with a frequency control signal 30g (discussed further below) to produce a demodulated receive signal 22a representing the original serial data. Also produced is a DC receive signal strength indicator ("RSSI") signal 22b, which indicates the signal strength of the received signal.

The receiver 102, i.e. the down-converter 110 and discriminator 112, receives a receiver power down signal 30a which acts as a form of an enablement signal. When this signal 30a is "false," the receiver 102 is enabled, i.e. powered up, and when this signal 30a is "true," the receiver 102 is disabled, i.e. powered down, to minimize DC power consumption.

The transmitter 104a has a PLL 114 which produces an RF transmit signal 130 which is selectively routed by the transmit signal switch 116 in accordance with its switch control signal 30f. When the transceiver 14a is operating in the transmit mode, the transmit signal switch 116 sends the RF signal 132 to the power amplifier 118. The amplified transmit signal 134 is sent to the antenna signal switch 108 which, in accordance with its switch control signal 30f, sends it on to be filtered by the filter 106 and transmitted via the antenna 12. When the transceiver 14a is operating in the receive mode, the RF signal 130 from the PLL 114 is routed by the transmit signal switch 116 to the down-converter 110 in the receiver 102 as the receiver LO signal 124.

During signal transmission, the PLL 114 receives a transmit signal 24a from the transceiver interface 16. This transmit signal 24a is used to directly modulate the RF transmit carrier produced by a voltage-controlled oscillator ("VCO") within the PLL 114. The modulated signal 130 is then initially routed (by the transmit signal router 116), amplified (by the power amplifier 118), routed again (by the antenna signal router 108), filtered (by the filter 106) and transmitted (via the antenna 12). The PLL 114 also receives a PLL program signal 30e which is used to selectively program a frequency divider within the PLL 114. This causes its output signal 130 to selectively vary in frequency, depending upon whether it is to be used as the transmit carrier signal 132 or as the receiver LO signal 124. Further discussion of the transmitter 104a can be found in the above-cited parent application having Ser. No. 08/029,134 (the specification of which is incorporated herein by reference).

Alternatively, the antenna signal switch 108 can be replaced with a circulator. An advantage of a circulator would be that no switch control signal 30f would be necessary. Incoming signals on the RF transmission line 120 would be circulated electromagnetically within the circulator to be outputted as the receive signal 122. Similarly, outgoing signals 134 will be circulated electromagnetically to be outputted on the RF transmission line 120.

Figure 4:
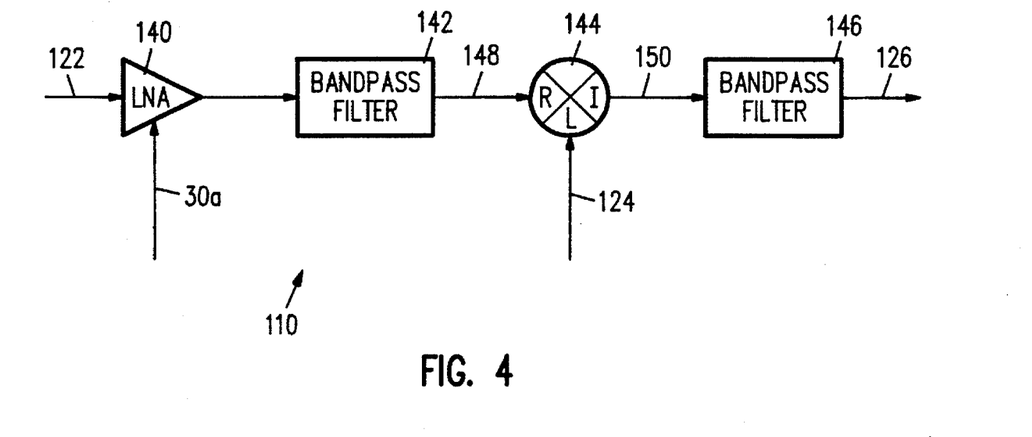
FIG. 4 is a block diagram of the down-converter of the transceiver of FIG. 3.

Referring to FIG. 4, the down-converter 110 includes a low-noise amplifier ("LNA") 140, RF bandpass filter 142, mixer 144 and IF bandpass filter 146, as shown. The modulated receive signal 122 is amplified by the LNA 140 and filtered by the RF bandpass filter 142. The amplified, filtered signal 148 is down-converted in the mixer 144 by being mixed with the receiver LO signal 124. This produces an intermediate IF signal 150 which is filtered by the IF bandpass filter 146 to produce the IF signal 126 sent to the discriminator 112.

Figure 5:
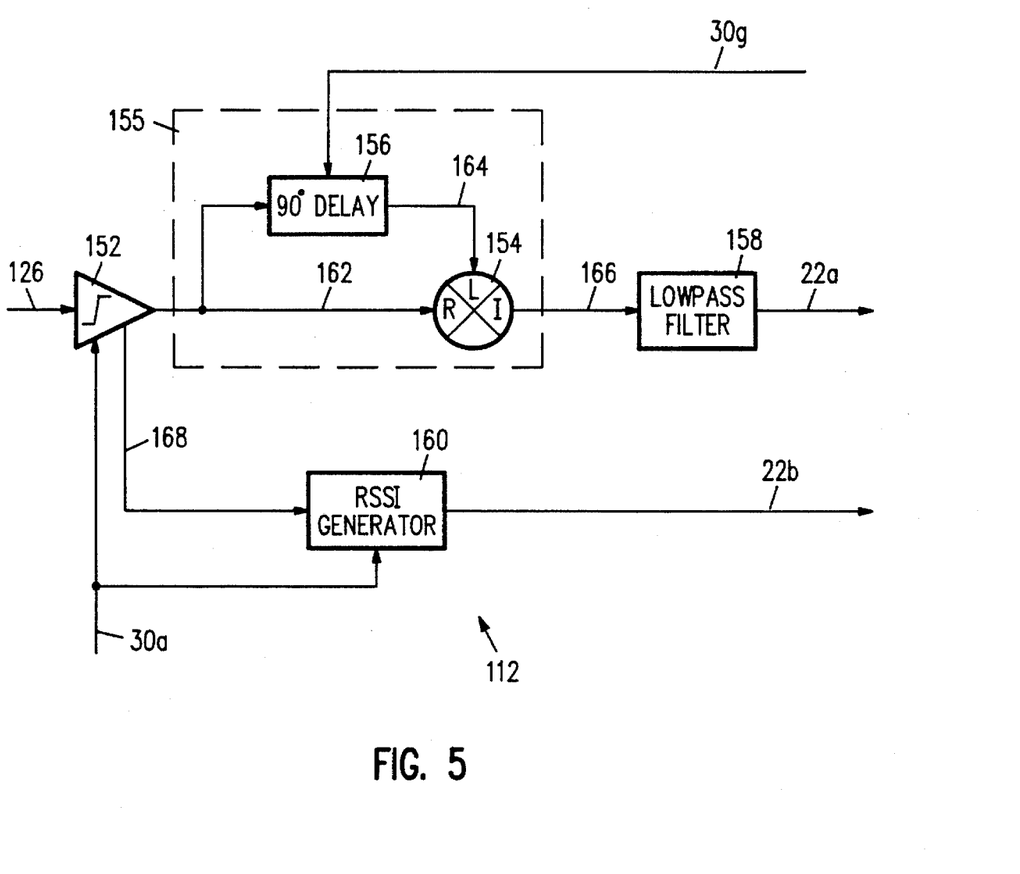
FIG. 5 is a block diagram of the discriminator of the transceiver of FIG. 3.

Referring to FIG. 5, the discriminator 112 includes a limiting amplifier 152, mixer 154, ninety-degree (90°) delay element 156, lowpass filter 158 and RSSI generator 160, as shown. As discussed further below, the delay element 156 is a frequency-dependent phase shifter which imposes a ninety-degree (90°) phase shift upon signals passing therethrough at its resonant frequency $f_R$. This interconnection of the mixer (preferably a Gilbert cell mixer) 154 and delay element 156 (e.g. a quadrature tank circuit) produces a frequency demodulator 155 (discussed further below). The IF signal 126 from the down-converter 110 is inputted to the limiting amplifier 152. The limited output signal 162 is inputted to the RF port of the mixer 154 and to the delay element 156. The delayed signal 164 is inputted to the LO port of the mixer 154. These signals 162, 164 mix and produce a frequency-demodulated signal 166 which is low-pass filtered by the filter 158 to produce the demodulated receive signal 22a. The limiting amplifier 152 also has a DC output signal 168 which is used by the RSSI generator 160 to produce the RSSI signal 22b, which is proportional to the logarithm of the level of the input signal 126 to the limiter 152.

As noted above, the delay element 156 receives a frequency control signal 30g. This frequency control signal 30g is in the form of a dc voltage and is preferably between 0.5 and 2.5 volts (with VCC=+3 volts dc). This frequency control signal 30g is selectively controlled (discussed further below) by the host controller 18 (FIG. 1) to adjust the resonant frequency of the delay element 156 so as to provide compensation for phase shifts caused by component value changes due to temperature variations and/or shifts in the carrier frequency of the received FM signal 20a.

Figure 6A:
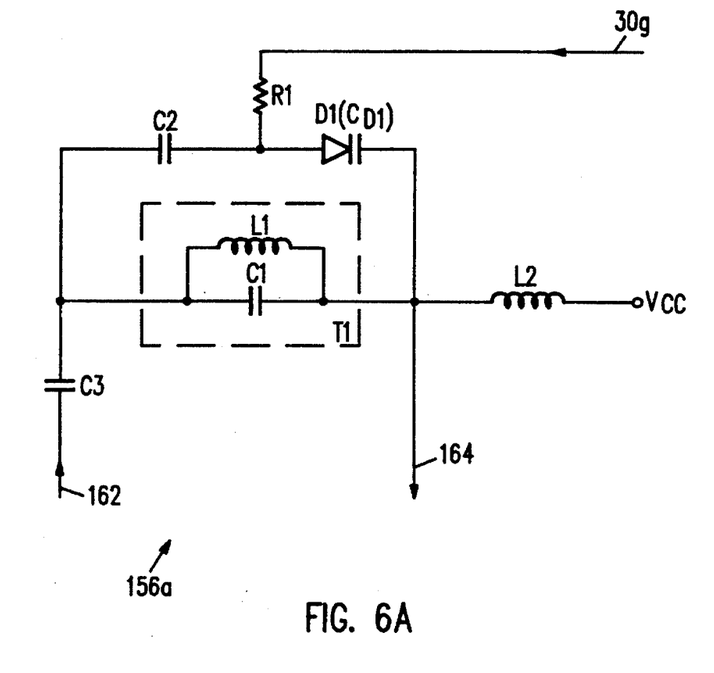
FIG. 6A is a schematic diagram of a preferred embodiment of the delay element of the discriminator of FIG. 5.

Referring to FIG. 6A, the delay element 156 can be realized by constructing a quadrature tank circuit 156a, as shown. This parallel resonant circuit 156a introduces a 90° phase shift between the input 162 and output 164 signals at the desired frequency. In accordance with a preferred embodiment of the present invention, wherein the signal frequency is approximately 110.592 Megahertz ("MHz"), approximate values for the components of the quadrature tank circuit 156a are as shown below in Table 1.

TABLE 1

(FIG. 6A)

| PARAMETER/COMPONENT | VALUE/TYPE |
| --- | --- |
| VCC | +3.0 VDC |
| D1 | Hyperabrupt varactor diode (Alpha Industries 1204–15) |
| T1 | Quadrature tank circuit (Toko, Inc. 638AH-0294) $L1 \approx 115$ nanohenry (nH) $C1 \approx 15$ picofarad (pF) |
| L2 | 2 microhenry (µH) |
| C2 | 5 pF |
| C3 | 1 pF |
| R1 | 5 kilohm (KΩ) |

It can be shown that the resonant frequency $f_R$ (in Hertz) of the quadrature tank circuit 156a of FIG. 6A is approximately:

$$f_R \approx 1/[2\pi \sqrt{(L)(Ceq)}\,] \quad (1)$$

where: $Ceq = C1 + (C2)(C_{D1})/(C2 + C_{D1})$

As is well known in the art, the capacitance $C_{D1}$, and therefore the impedance $X_{D1}$, of the varactor D1 is dependent upon the voltage potential across the PN junction between the anode and cathode of the varactor D1. Thus, as can be seen from Equation (1) above, adjusting the capacitance $C_{D1}$, and therefore the impedance $X_{D1}$, of the varactor D1 by adjusting the frequency control signal 30g will cause the resonant frequency $f_R$ of the quadrature tank circuit 156a to change.

In accordance with Equation (1) above, the phase shift θ imposed upon the input signal 162 varies with the instantaneous signal frequency $f_S$ thereof, with θ=90° at 110.592 MHz. As should be understood, at signal frequencies $f_S$ above resonance $f_R$ the net impedance $Z_{QT}$ of the quadrature tank circuit 156a is inductive, and at signal frequencies $f_S$ below resonance $f_R$ the net impedance $Z_{QT}$ of the quadrature tank circuit 156a is capacitive. Thus, for the preferred embodiment of the quadrature tank circuit 156a shown in FIG. 6A, as the frequency control signal 30g is varied between 0.5 and 2.5 volts dc, with VCC=+3 volts dc, the resonant frequency $f_R$ is approximately between 108 Mhz and 113 Mhz.

Figure 6B:
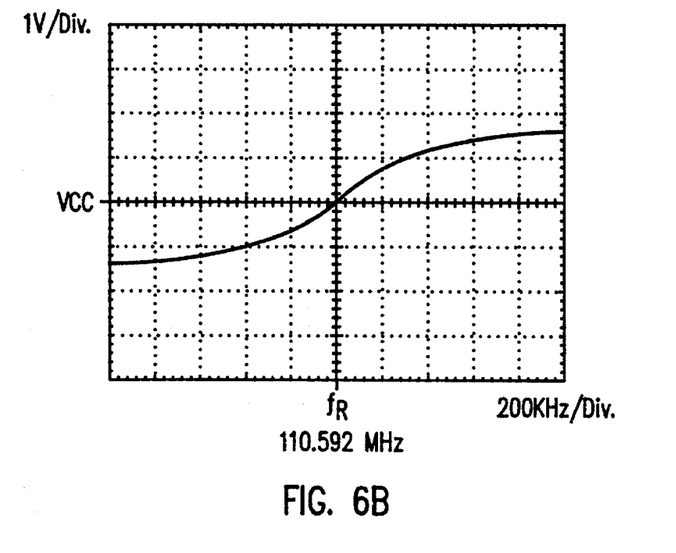
FIGS. 6B, 6C and 6D illustrate the voltage gain versus frequency characteristic for a signal passing through the delay element of the discriminator of FIG. 5 under various discriminator control signal conditions.
Figure 6C:
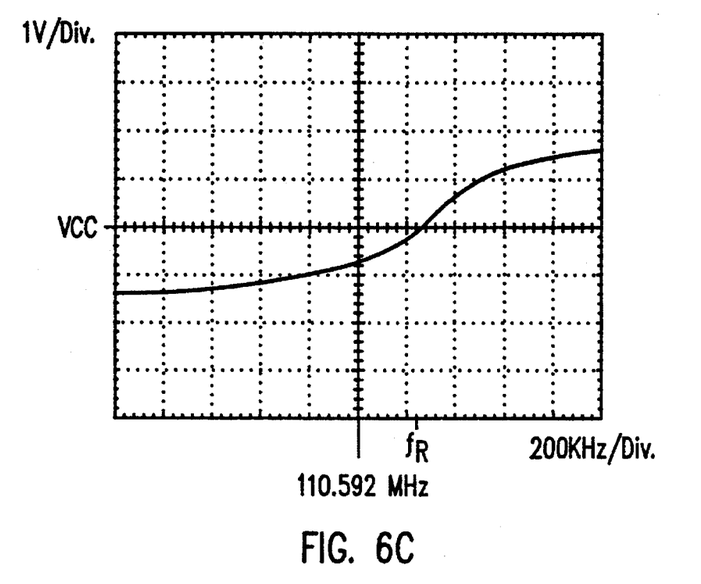
Figure 6D:
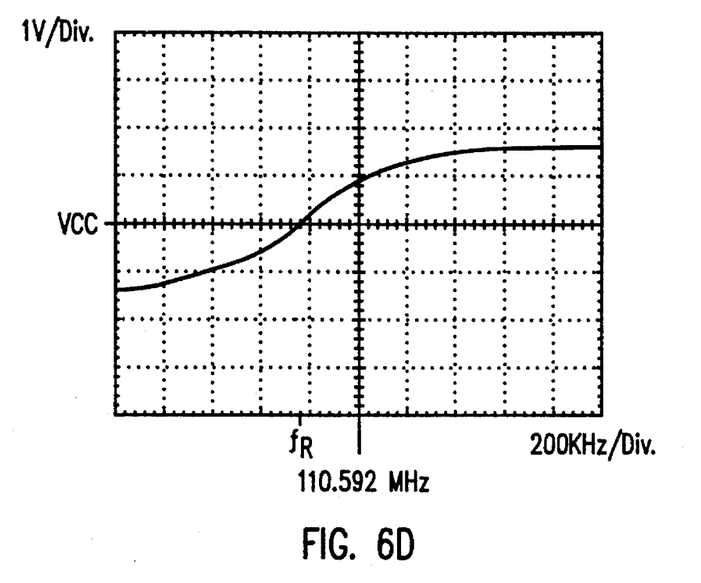

Referring to FIGS. 6B, 6C and 6D, the voltage gain versus frequency characteristics, or "S-curves", for the preferred embodiment of the quadrature tank circuit 156a shown in FIG. 6A for various frequency control signal 30g values is as shown. In FIG. 6B, the frequency control signal 30g is +1.4 volts dc; therefore the resonant frequency $f_R$ is approximately 110.592 Mhz. In FIG. 6C, the frequency control signal 30g is +1.3 volts dc; therefore the resonant frequency $f_R$ has shifted up by approximately 250 kilohertz ("kHz") to 110.842 Mhz. In FIG. 6D, the frequency control signal 30g is +1.5 volts dc; therefore the resonant frequency $f_R$ has shifted down by approximately 250 kHz to 110.342 Mhz.

Figure 7:
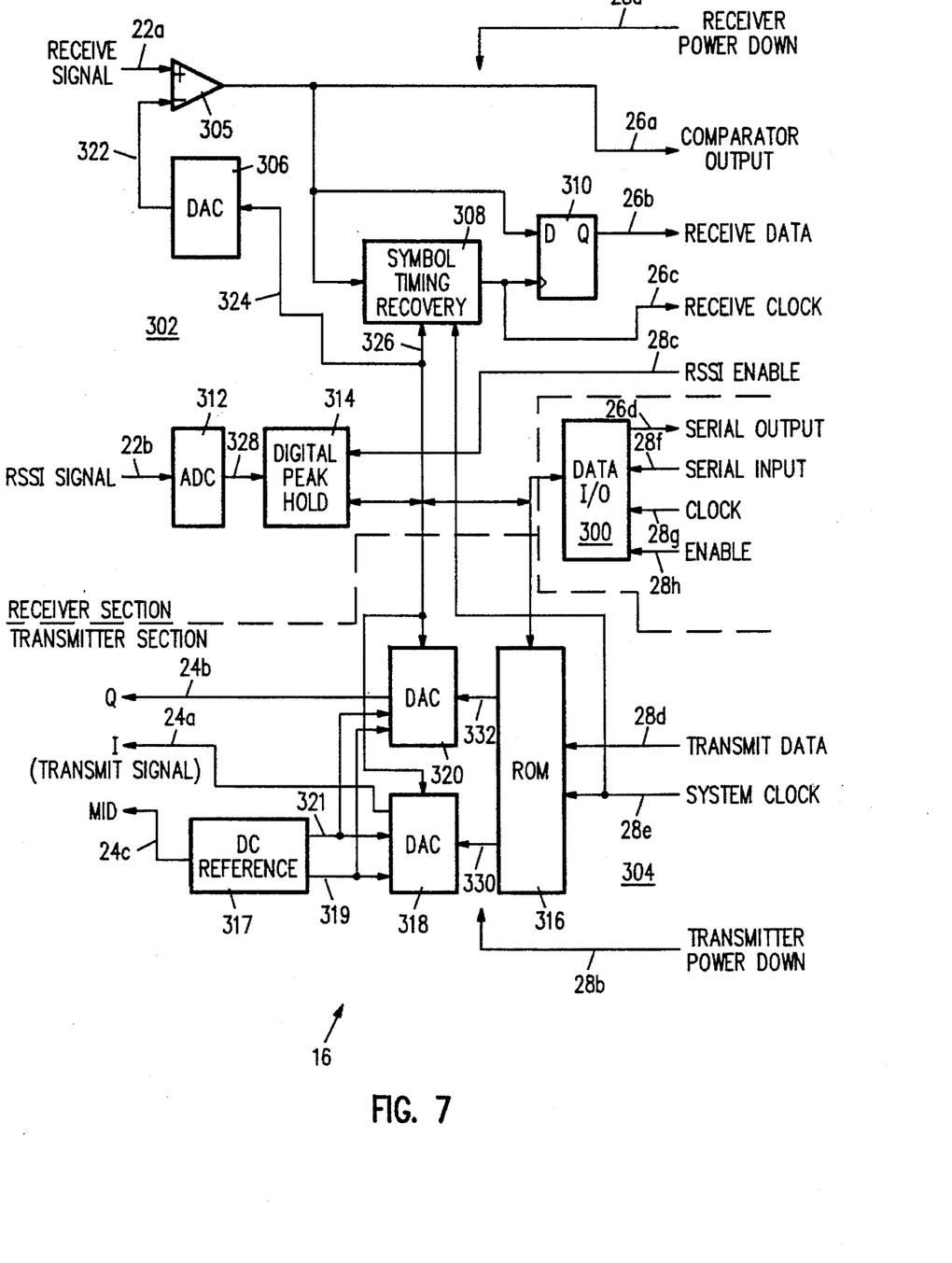
FIG. 7 is a block diagram of the transceiver interface of FIG. 1.

Referring to FIG. 7, the transceiver interface 16 includes a data input/output ("I/O") circuit 300, receiver section 302 and transmitter section 304, as shown. The data I/O 300 receives a serial data input signal 28f, a data clock 28g and enable signal 28h, and provides a serial data output signal 26d. It is via these signal lines 26d, 28f, 28g, 28h that input and output data and commands are routed between the host controller 18 and the receiver 302 and transmitter 304 sections of the transceiver interface 16.

The receiver section 302 includes a voltage comparator 305, digital-to-analog converter ("DAC") 306, symbol timing recovery ("STR") circuit 308, D-type flip-flop 310, analog-to-digital converter ("ADC") 312 and digital peak hold circuit 314, as shown. The transmitter section 304 includes a read-only memory ("ROM") 316, two DACs 318, 320 and a DC reference generator 317, as shown. The active elements within the receiver section 302 can be selectively powered down by a receiver power down signal 28a from the host controller 18, as can the active elements within the transmitter section 304 by a transmitter power down signal 28b.

In the receiver section 302, the receive signal 22a from the discriminator 112 of the transceiver 14 is received by the voltage comparator 305, and compared against an analog threshold voltage 322 provided by the DAC 306. This produces a binary comparator output signal 26a. This binary signal 26a is fed to the D-input of the flip-flop 310 and to the STR circuit 308. As discussed further below, the STR circuit 308 recovers the receive data clock 26c associated with the incoming data, and uses it via the flip-flop 310 to sample the binary comparator output signal 26a. This results in recovery of the receive data 26b and receive data clock 26c. As discussed further in the above-cited parent application having Ser. No. 08/029,134, the binary comparator output 26a can be used to adjust the analog threshold voltage 322 outputted by the DAC 306 (i.e. in accordance with the digital input signal 324 to the DAC 306).

Discussion of the remainder of the receiver section 302 and of the transmitter section 304 can be found in the above-cited parent application having Ser. No. 08/029,134.

Figure 8A:
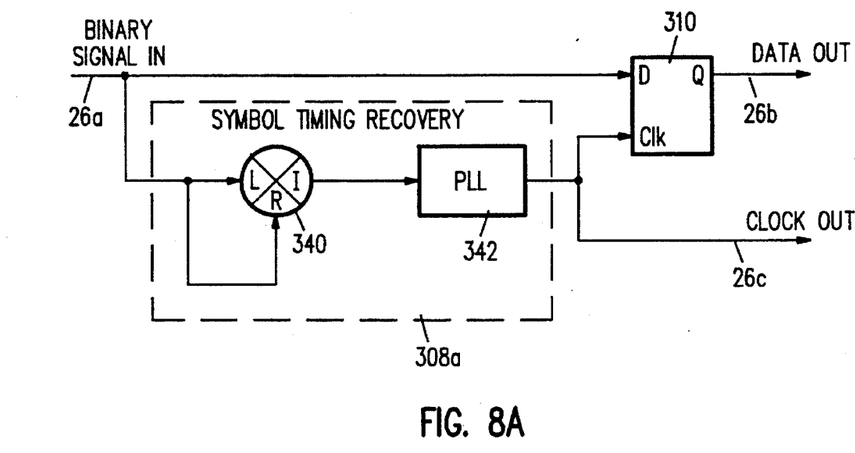
FIG. 8A is a block diagram of the symbol timing recovery circuit of the transceiver interface of FIG. 7.

Referring to FIG. 8A, an STR circuit 308a in accordance with the present invention uses a mixer 340 and PLL 342, as shown. The mixer 340, with the input signal 26a fed to its LO and RF ports, acts as a frequency doubler and produces an IF signal with discrete frequency elements at the bit rate frequency. The PLL 342 filters out random data noise and produces the data clock 26c. In a preferred embodiment, the STR circuit 308a is an all-digital implementation in which an EXCLUSIVE-OR gate multiplier is used for the mixer 340 and an all-digital PLL (e.g. with a numerically-controlled oscillator, digital phase comparator and digital loop filter) is used for the PLL 342.

Figure 8B:
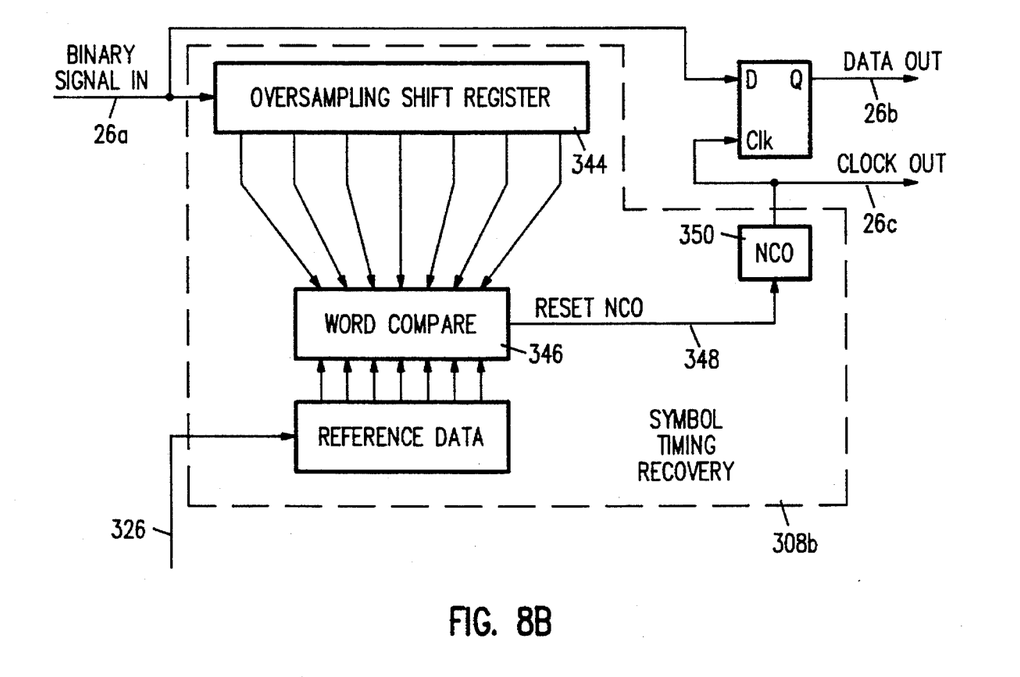
FIG. 8B is a block diagram of an alternative symbol timing recovery circuit for the transceiver interface of FIG. 7.

Referring to FIG. 8B, an alternative embodiment of an STR circuit 308b in accordance with the present invention uses a correlator. When instructed to begin searching for a known data sequence (e.g. the preamble or a predetermined bit sequence of the incoming receive data stream), the shift register 344 begins oversampling the incoming data 26a. As soon as the incoming data within the shift register 344 matches the reference data 326, the comparator 346 outputs a reset signal 348 to reset the free running clock generator 350 (e.g. a numerically-controlled oscillator), thereby providing the recovered data clock 26c.

Figure 9A:
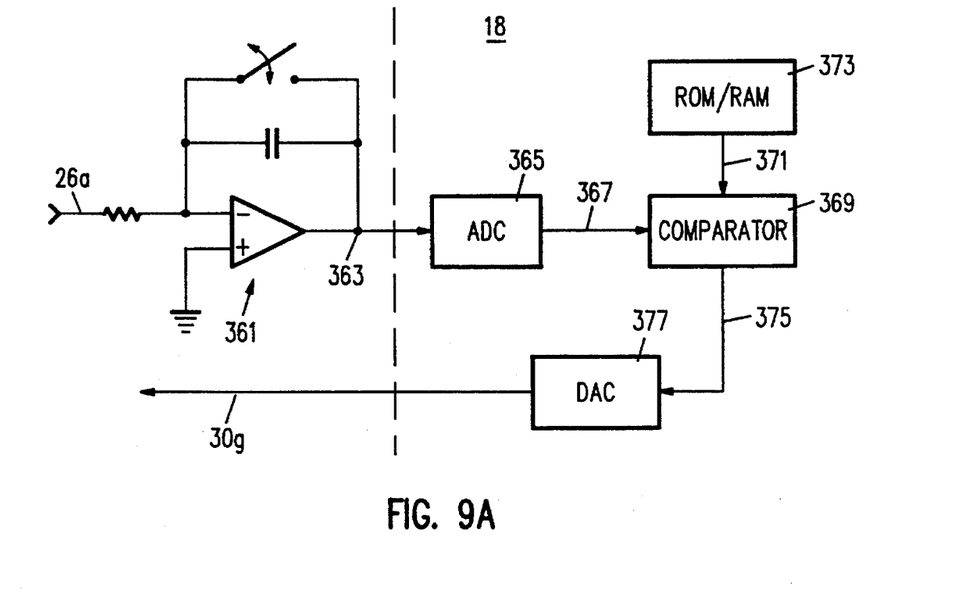
FIGS. 9A and 9B are block diagrams of exemplary duty cycle monitoring circuits for use with the transceiver interface of FIG. 7.

Referring to FIG. 9A, the adjustment of the analog frequency control signal 30g for the delay element 156 of the demodulator 155 within the discriminator 112 can be better understood. In one embodiment, the binary comparator output 26a is inputted to an integrator circuit 361. The integrated output 363 (reset to zero between receive data bursts with a reset switch) is converted by an ADC 365 to a digital signal 367 which is compared in a comparator 369 against a reference 371 stored in a memory 373. The result 375, representing either the same or a new demodulator resonant frequency setting (i.e. for the delay element 156), is sent to a DAC 377 to be converted to the analog frequency control signal 30g for communication to the delay element 156 within the discriminator 112 (discussed above).

Figure 9B:
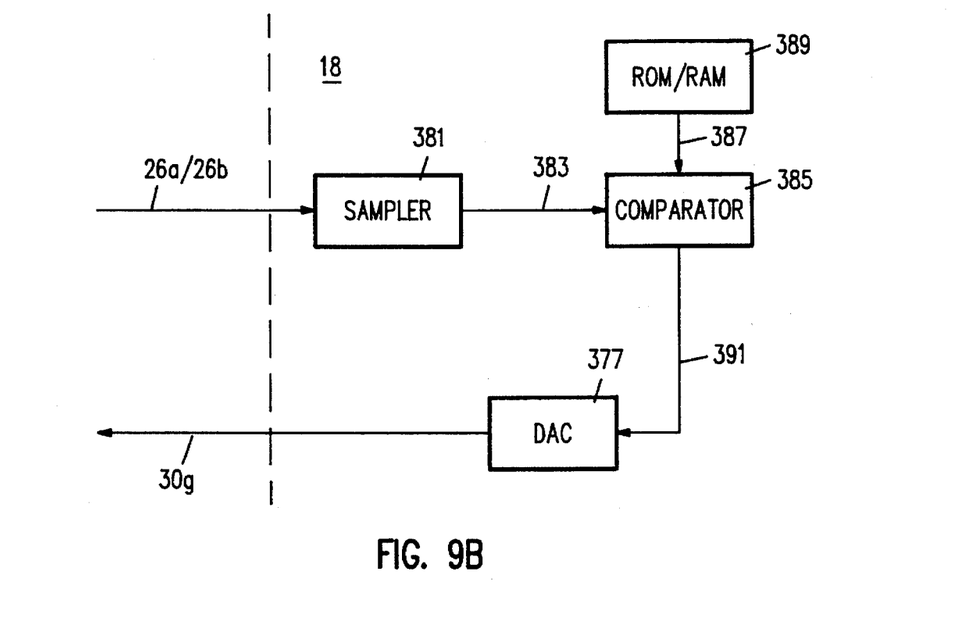

Referring to FIG. 9B, in an alternative embodiment, the binary comparator output 26a, or alternatively the recovered data signal 26b, is inputted to a sampler 381. The sampled output 383 is compared in a comparator 385 against a reference 387 from a memory 389. The result 391, representing the same or a modified demodulator resonant frequency value, is sent to a DAC 377 to be converted to the analog frequency control signal 30g for communication to the delay element 156 within the discriminator 112 (discussed above).

The sampler 381 is used to sample the input signal 26a/26b to produce a sampled output signal 383 which consists of a number of logical ones ("1s") and zeros ("0s"). The comparison of this sampled signal 383 with the reference 387 by the comparator 385 is accomplished by counting the number of 1s and 0s within the sampled signal 383 and comparing that count against a reference count of 1s and/or 0s for the reference data 387. If the count is the same, the output 391 of the comparator 385 will be same as before, and the output frequency control signal 30g of the DAC 377 will be unchanged. However, if the count is different, the output 391 of the comparator 385 will reflect that difference, and the output frequency control signal 30g of the DAC 377 will be changed accordingly.

Figure 10:
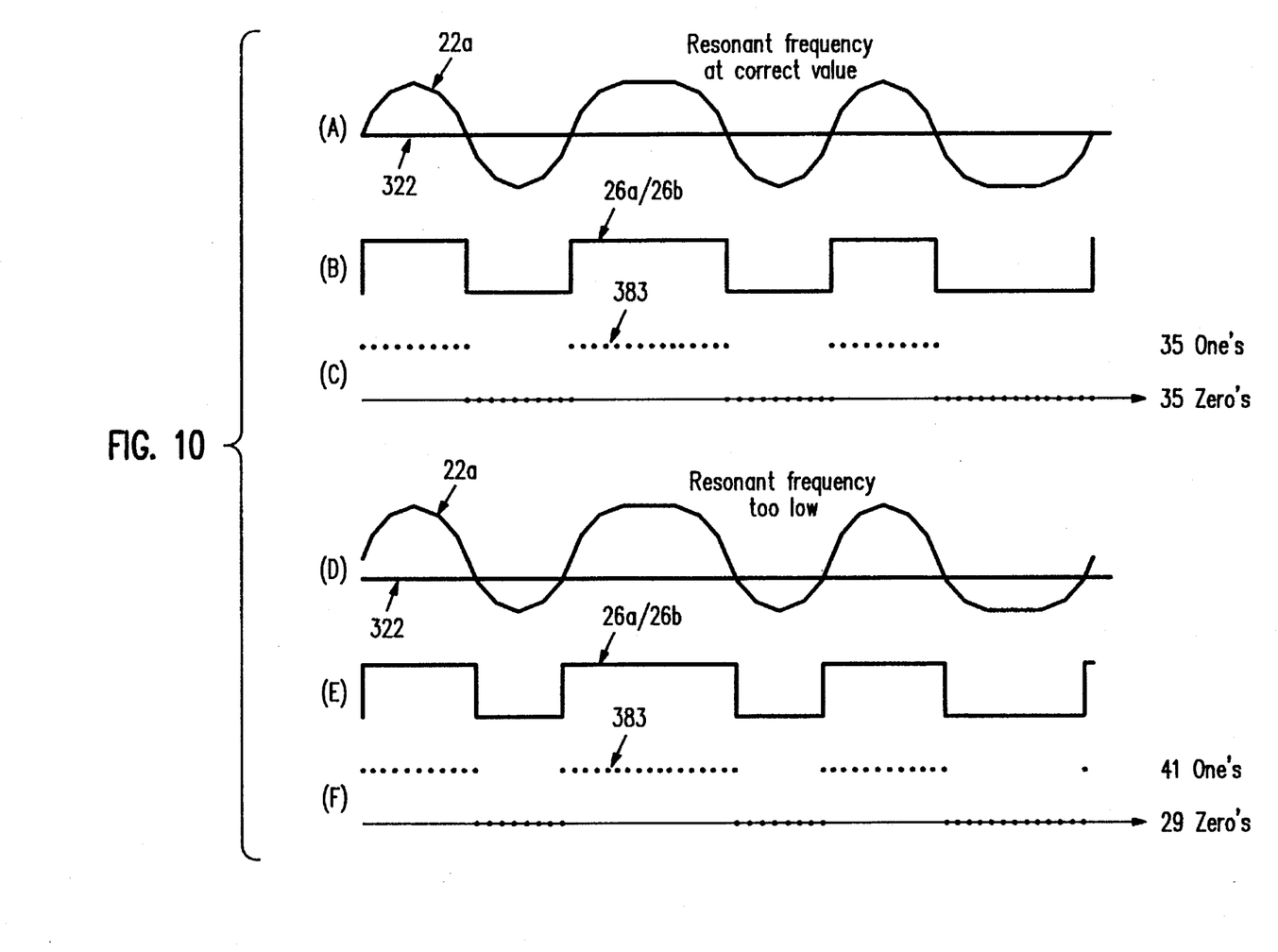
FIG. 10 illustrates exemplary signals and timing relationships for the duty cycle monitoring circuits of FIGS. 9A and 9B.

Referring to FIG. 10, this method of comparing sample counts can be better understood. In FIG. 10A, the comparator threshold 322 and demodulator resonant frequency are set at their correct values for the incoming receive signal 122 (FIG. 3). This results in the demodulated receive signal 22a shown in FIG. 10A, and the binary output signal 26a or recovered data signal 26b shown in FIG. 10B, which in turn results in the sampled signal 383 shown in FIG. 10C. The "count" of 1s and 0s in this example is equal to the reference 387 stored in the memory 389. Accordingly, the output 391 of the comparator 385 and therefore the output frequency control signal 30g of the DAC 377 remains unchanged.

However, as shown in FIG. 10D, when the demodulator resonant frequency is too low relative to the center, or carrier, frequency of the incoming modulated receive signal 122, the DC component of the demodulated receive signal 22a shifts, thereby causing the resulting binary output signal 26a or recovered data signal 26b, as shown in FIG. 10E, to have an improper duty cycle. This will be seen when comparing the sampled output 383, shown in FIG. 10F, with the reference 387. Accordingly, the output 391 from the comparator 385 will cause the output 30g of the DAC 377 to change, thereby adjusting the resonant frequency of the delay element 156 within the discriminator 112 (FIG. 5), and in turn, causing the foregoing signals 22a, 26a/26b, 383 to appear as shown in FIGS. 10A through 10C.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments. It is intended that the following claims define the scope of the present invention, and that structures and methods within the scope of these claims and their equivalence be covered thereby.

What is claimed is:

1. A demodulator with a selectable resonant frequency of operation for demodulating a frequency-modulated signal comprising:

demodulator means with an adjustable resonant frequency of operation for receiving and demodulating a frequency-modulated signal which has a signal carrier frequency associated therewith to produce a binary demodulated signal which has a duty cycle associated therewith, and for receiving a frequency control signal and in accordance therewith adjusting said adjustable resonant frequency of operation; and controller means, coupled to said demodulator means for receiving and analyzing said binary demodulated signal duty cycle and in accordance therewith providing said frequency control signal.

2. A demodulator as recited in claim 1, wherein said demodulator means comprises a mixer and coupled thereto a phase delay circuit with said adjustable resonant frequency of operation associated therewith, wherein said mixer and phase delay circuit receive said frequency-modulated signal, said phase delay circuit provides a phase-delayed frequency-modulated signal to said mixer, and said mixer mixes said frequency-modulated and phase-delayed frequency-modulated signals to provide said binary demodulated signal, and further wherein said phase delay circuit includes adjuster means for receiving said frequency control signal and in accordance therewith adjusting said adjustable resonant frequency of operation.

3. A demodulator as recited in claim 2, wherein said phase delay circuit comprises a quadrature tank circuit.

4. A demodulator as recited in claim 2, wherein said adjuster means comprises a varactor diode.

5. A demodulator as recited in claim 1, wherein said controller means comprises a duty cycle monitor for measuring said binary demodulated signal duty cycle and in accordance therewith providing said frequency control signal.

6. A demodulator as recited in claim 5, wherein said duty cycle monitor comprises an integrator for integrating said binary demodulated signal to produce a dc output signal and in accordance therewith provide said frequency control signal.

7. A demodulator as recited in claim 1, wherein said controller means comprises comparator means for receiving and comparing said binary demodulated signal with a binary reference signal, and in accordance therewith providing said frequency control signal.

8. A demodulator as recited in claim 7, wherein said comparator means comprises:

sampler means for sampling said binary demodulated signal to provide a binary sample signal which represents a first plurality of logical ones and zeroes; and binary comparator means, coupled to said sampler means, for receiving and comparing said binary sample signal with said binary reference signal which represents a second plurality of logical ones and zeroes, and in accordance therewith providing said frequency control signal.

9. A demodulator as recited in claim 7, wherein said comparator means comprises:

symbol timing recovery means for recovering from said binary demodulated signal a data signal which represents a plurality of serial binary data bits and a data clock signal associated therewith;

sampler means, coupled to said symbol timing recovery means for receiving and sampling said data signal to provide a data sample signal which represents a first plurality of logical ones and zeroes; and binary comparator means, coupled to said sampler means, for receiving and comparing said data sample signal with said binary reference signal which represents a second plurality of logical ones and zeroes, and in accordance therewith providing said frequency control signal.

10. A demodulator as recited in claim 9, wherein said symbol timing recovery means comprises a phase-lock-loop.

11. A demodulator as recited in claim 9, wherein said symbol timing recovery means comprises a correlator.

12. A demodulator with a selectable resonant frequency of operation for demodulating a frequency-modulated signal, comprising:

a demodulator with an adjustable resonant frequency of operation which receives and demodulates a frequency-modulated signal which has a signal carrier frequency associated therewith and produces a binary demodulated signal which has a duty cycle associated therewith, and which receives a frequency control signal and in accordance therewith adjusts said adjustable resonant frequency of operation; and a signal controller, coupled to said demodulator which receives and analyzes said binary demodulated signal duty cycle and in accordance therewith provides said frequency control signal.

13. A demodulator as recited in claim 12, wherein said demodulator comprises a mixer and coupled thereto a phase delay circuit with said adjustable resonant frequency of operation associated therewith, wherein said mixer and phase delay circuit receive said frequency-modulated signal, said phase delay circuit provides a phase-delayed frequency-modulated signal to said mixer, and said mixer mixes said frequency-modulated and phase-delayed frequency-modulated signals to provide said binary demodulated signal, and further wherein said phase delay circuit includes a circuit component with an adjustable value which receives said frequency control signal and in accordance therewith adjusts said adjustable resonant frequency of operation.

14. A demodulator as recited in claim 13, wherein said phase delay circuit comprises a quadrature tank circuit.

15. A demodulator as recited in claim 13, wherein said circuit component comprises a varactor diode.

16. A demodulator as recited in claim 12, wherein said signal controller comprises a duty cycle monitor circuit which measures said binary demodulated signal duty cycle and in accordance therewith provides said frequency control signal.

17. A demodulator as recited in claim 16, wherein said duty cycle monitor circuit comprises an integrator circuit which integrates said binary demodulated signal and produces a dc output signal, and in accordance therewith provides said frequency control signal.

18. A demodulator as recited in claim 12, wherein said signal controller comprises a signal comparison circuit which receives and compares said binary demodulated signal with a binary reference signal, and in accordance therewith provides said frequency control signal.

19. A demodulator as recited in claim 18, wherein said signal comparison circuit comprises:

a sampling circuit which samples said binary demodulated signal and provides a binary sample signal which represents a first plurality of logical ones and zeroes; and a binary comparison circuit, coupled to said sampling circuit, which receives and compares said binary sample signal with said binary reference signal which represents a second plurality of logical ones and zeroes, and in accordance therewith provides said frequency control signal.

20. A demodulator as recited in claim 18, wherein said signal comparison circuit comprises:

a symbol timing recovery circuit for recovering from said binary demodulated signal data signal which represents a plurality of serial binary data bits and a data clock signal associated therewith;

a sampling circuit, coupled to said symbol timing recovery circuit, which receives and samples said data signal and provides a data sample signal which represents a first plurality of logical ones and zeroes; and a binary comparison circuit, coupled to said sampling circuit, which receives and compares said data sample signal with said binary reference signal which represents a second plurality of logical ones and zeroes, and in accordance therewith provides said frequency control signal.

21. A demodulator as recited in claim 20, wherein said symbol timing recovery circuit comprises a phase-lock-loop.

22. A demodulator as recited in claim 20, wherein said symbol timing recovery circuit comprises a correlator.

23. A demodulation method for using a selectable resonant frequency of operation to demodulate a frequency-modulated signal, comprising the steps of:

receiving and demodulating with an adjustable resonant frequency of operation a frequency-modulated signal which has a signal carrier frequency associated therewith to produce a binary demodulated signal which has a duty cycle associated therewith;

receiving a frequency control signal and in accordance therewith adjusting said adjustable resonant frequency of operation; and analyzing said binary demodulated signal duty cycle and in accordance therewith providing said frequency control signal.

24. A demodulation method as recited in claim 23, wherein said step of receiving and demodulating with an adjustable resonant frequency of operation a frequency-modulated signal which has a signal carrier frequency associated therewith to produce a binary demodulated signal comprises the steps of:

phase-delaying said frequency-modulated signal in accordance with said adjustable resonant frequency of operation to provide a phase-delayed frequency-modulated signal; and mixing said frequency-modulated signal and said phase-delayed frequency-modulated signal in a mixer to provide said binary demodulated signal.

25. A demodulation method as recited in claim 24, wherein said step of phase-delaying said frequency-modulated signal in accordance with said adjustable resonant frequency of operation to provide a phase-delayed frequency-modulated signal comprises the step of inputting said frequency-modulated signal to a quadrature tank circuit.

26. A demodulation method as recited in claim 24, wherein said step of receiving a frequency control signal and in accordance therewith adjusting said adjustable resonant frequency of operation comprises the step of receiving said frequency control signal with a varactor diode.

27. A demodulation method as recited in claim 23, wherein said step of analyzing said demodulated signal and in accordance therewith providing said frequency control signal comprises the step of measuring said binary demodulated signal duty cycle and in accordance therewith providing said frequency control signal.

28. A demodulation method as recited in claim 27, wherein said step of measuring said binary demodulated signal duty cycle and in accordance therewith providing said frequency control signal comprises the step of integrating said binary signal to produce a dc output signal and in accordance therewith provide said frequency control signal.

29. A demodulation method as recited in claim 23, wherein said step of analyzing said binary demodulated signal and in accordance therewith providing said frequency control signal comprises the step of receiving and comparing said binary demodulated signal with a binary reference signal and in accordance therewith providing said frequency control signal.

30. A demodulation method as recited in claim 29, wherein said step of receiving and comparing said binary demodulated signal with a binary reference signal and in accordance therewith providing said frequency control signal comprises the steps of:

sampling said binary demodulated signal to provide a binary sample signal which represents a first plurality of logical ones and zeroes; and comparing said binary sample signal with said binary reference signal which represents a second plurality of logical ones and zeroes, and in accordance therewith providing said frequency control signal.

31. A demodulation method as recited in claim 29, wherein said step of receiving and comparing said binary demodulated signal with a binary reference signal and in accordance therewith providing said frequency control signal comprises the steps of:

recovering from said binary demodulated signal a data signal which represents a plurality of serial binary data bits and a data clock signal associated therewith;

sampling said data signal to provide a data sample signal which represents a first plurality of logical ones and zeroes; and comparing said data sample signal with said binary reference signal which represents a second plurality of logical ones and zeroes, and in accordance therewith providing said frequency control signal.

32. A demodulation method as recited in claim 31, wherein said step of recovering from said binary demodulated signal a data signal which represents a plurality of serial binary data bits and a data clock signal associated therewith comprises the step of recovering said data signal and said data clock signal from said binary demodulated signal with a phase-lock-loop.

33. A demodulation method as recited in claim 31, wherein said step of recovering from said binary demodulated signal data signal which represents a plurality of serial binary data bits and a data clock signal associated therewith comprises the step of recovering said data signal and said data clock signal from said binary demodulated signal with a correlator.

* * * * *

UNITED STATES PATENT AND TRADEMARK OFFICE
CERTIFICATE OF CORRECTION

PATENT NO. : 5,453,714
DATED : September 26, 1995
INVENTOR(S) : BENNY MADSEN

It is certified that error appears in the above-indentified patent and that said Letters Patent is hereby corrected as shown below:

In Col. 9, line 8, please insert a --,-- after "means".

In Col. 9, line 33, please insert a --,-- after "demodulator".

In Col. 10, line 17, please insert --a-- after the first occurrence of "signal".

In Col. 12, line 31, please insert --a-- after the first occurrence of "signal".

Signed and Sealed this

Thirteenth Day of February, 1996

Attest:

BRUCE LEHMAN

*Attesting Officer*     Commissioner of Patents and Trademarks